(12) United States Patent
Lee et al.

(10) Patent No.: US 6,489,643 B1
(45) Date of Patent: Dec. 3, 2002

(54) PHOTODIODE HAVING A PLURALITY OF PN JUNCTIONS AND IMAGE SENSOR HAVING THE SAME

(75) Inventors: Ju Il Lee, Ichon-shi (KR); Myung Hwan Cha, Ichon-shi (KR); Nan Yi Lee, Ichon-shi (KR)

(73) Assignee: Hynix Semiconductor Inc.

(*) Notice: Subject to any disclaimer, the term of this patent is extended or adjusted under 35 U.S.C. 154(b) by 0 days.

(21) Appl. No.: 09/340,750

(22) Filed: Jun. 28, 1999

(30) Foreign Application Priority Data

Jun. 27, 1998 (KR) ............................... 98-24575
Jun. 29, 1998 (KR) ............................... 98-24643

(51) Int. Cl.[7] ..................... H01L 27/146; H01L 27/148; H01L 29/768
(52) U.S. Cl. ....................... 257/292; 257/233
(58) Field of Search ................. 257/232, 233, 257/291, 292

(56) References Cited

U.S. PATENT DOCUMENTS

| 4,984,047 A | 1/1991 | Stevens | 357/30 |
| 5,051,797 A | 9/1991 | Erhardt | 357/24 |
| 5,841,159 A | 11/1998 | Lee et al. | 257/291 |
| 5,977,576 A | * 11/1999 | Hamasaki | 257/292 |
| 6,100,556 A | * 8/2000 | Drowley et al. | 257/292 |
| 6,127,697 A | * 10/2000 | Guidash | 257/292 |

* cited by examiner

Primary Examiner—Gene M. Munson
(74) Attorney, Agent, or Firm—Townsend and Townsend and Crew LLP

(57) ABSTRACT

The present invention relates to a pinned photodiode for an image sensor and a method for manufacturing the same; and, more particularly, to a pinned photodiode of an image sensor fabricated by CMOS processes and a manufacturing method thereof. The pinned photodiode, according to an embodiment of the present invention, comprises: a semiconductor layer of a first conductivity type; and at least two first doping regions of a second conductivity type alternately formed in the semiconductor layer and connected to each other at edges thereof so that the first doping regions have the same potential, wherein a plurality of PN junctions is formed in the semiconductor layer and the PN junctions improve a capturing capacity of photoelectric charges generated in the photodiode.

5 Claims, 10 Drawing Sheets

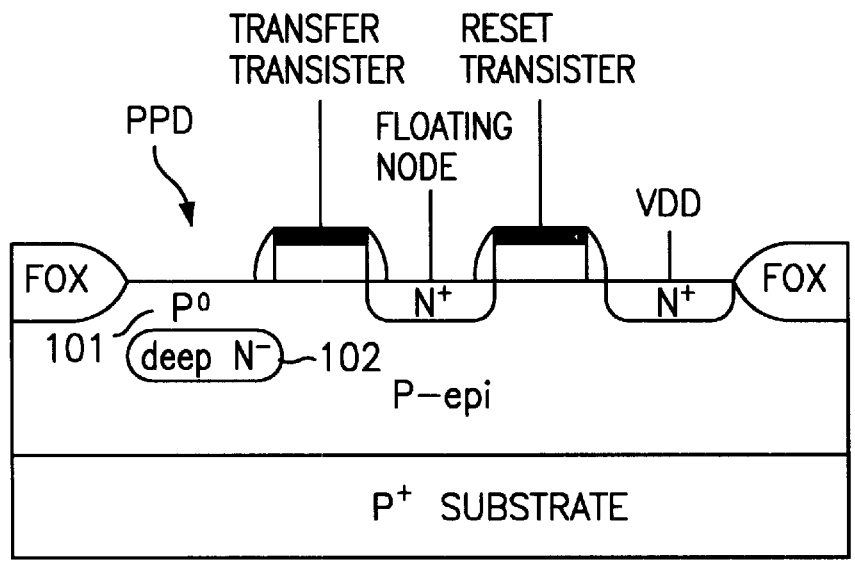
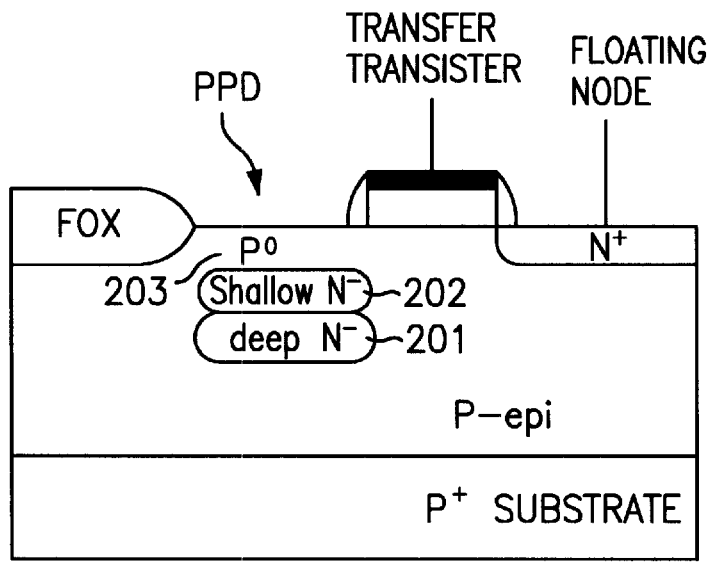

US 6,489,643 B1

PHOTODIODE HAVING A PLURALITY OF PN JUNCTIONS AND IMAGE SENSOR HAVING THE SAME

BACKGROUND OF THE INVENTION

The present invention relates to a pinned photodiode of an image sensor and a method for manufacturing the same, and, more particularly, to a pinned photodiode of an image sensor fabricated by CMOS processes (hereinafter, referred to as a "CMOS image sensor") and the manufacturing method thereof.

As is well-known to those skilled in the art, the pinned photodiode (PPD) has been widely used as an element to produce and integrate photoelectric charges generated in CCD or CMOS image sensors sensing light from an object. It could also be called a "buried photodiode" since it has a PNP (or NPN) junction structure which is buried in a substrate. Compared to photodiodes having other structures, such as a source/drain PN junction structure an MOS capacitor structure, etc., the PPD has various benefits. One advantage is the ability to increase depletion depth to bring about high quantum efficiency in converting incident photons into electric charges. That is, in a PPD having a PNP junction structure, the N-type region is fully depleted and the depletion region extendeds into both P-type regions, resulting in an increase in depletion depth. Accordingly, this vertical extension of the depletion depth increases the quantum efficiency, thereby producing excellent light sensitivity.

When a PNP junction PPD is employed in CMOS image sensors using a power supply voltage of less than 5V or 3.3V, both P regions must be held at the same potential, which must be less than the power supply voltage (e.g., 1.2V to 2.8V) in order for the N region to fully deplete. This technology is disclosed in U.S. Pat. No. 6,180,969, entitled "CMOS Image Sensor with Equivalent Potential Diode" filed on Feb. 26, 1999, which is assigned to "Hyundai Electronics Industries Co. Ltd.

FIG. 1. shows the low-power PPD disclosed in U.S. Pat. No. 6,180,969. The PPD has a PNP structure where an $N^-$ doping region 102 and a $P^0$ doping region 101 are formed in a P-epi (epitaxial) layer. At this time, an $N^-$ ion implantation mask for forming a deep $N^-$ and a $P^0$ ion implantation mask for $P^0$ is used. The newly formed masks differ from each other in their pattern width. That is, the open area for the $P^0$ doping region 101 is larger than that of the $N^-$ doping region 102. By bringing the P-epi layer into contact with $P^0$ doping region 101 so that the P-epi layer and $P^0$ doping region 101 have the same low voltage, this PPD can safely produce a full depletion layer in the $N^-$ doping region even at a voltage of less than 3.3V.

The PPD shown in FIG. 1 makes full depletion at a low voltage possible and, to some extent, improves the quantum efficiency. Further, it is possible to increase the depletion depth by using the P-epi layer. However, with this method it is not possible to obtain a depletion depth of the $N^-$ doping region sufficient to create high light sensitivity, even if the desired quantum efficiency is obtained.

SUMMARY OF THE INVENTION

It is, therefore, an object of the present invention to provide a pinned photodiode having an increased depletion depth in comparison with the prior art, and a manufacturing method thereof.

It is, therefore, another object of the present invention to provide a pinned photodiode to increase the constant charge capacity and a manufacturing method thereof.

In accordance with an aspect of the present invention, there is provided a pinned photodiode in an image sensor comprising: a semiconductor layer of a first conductivity type; a first doping region of a second conductivity type formed in the semiconductor layer, wherein the first doping region includes at least two multi-implantation layers which are formed by different ion acceleration energy and wherein the first doping region is set apart from a field oxide layer to isolate other adjacent photodiodes; and a second doping region of the first conductivity type formed between the first doping region and a surface of the semiconductor layer, wherein the area of the second doping region is larger than that of the first doping region, and wherein a thickness between the first doping region and the surface of the semiconductor layer is made thin by the multi-implantation layers.

In accordance with another aspect of the present invention, there is provided a pinned photodiode in an image sensor comprising: a semiconductor layer of a first conductivity type; and at least two first doping regions of a second conductivity type alternately formed in the semiconductor layer and connected to each other at edges thereof so that the first doping regions have the same potential, whereby a plurality of PN junctions are formed in the semiconductor layer and the PN junctions improve the capturing capacity of photoelectric charges generated in the photodiode.

In accordance with a further aspect of the present invention, there is provided a method for forming a pinned photodiode in an image sensor, the method comprising the steps of: providing a semiconductor layer of a first conductivity type; forming a field oxide layer to isolate an active region from a field region; forming a first ion implantation mask of which an edge covers a portion of the active region adjacent to the field region, opening the active region; forming a first doping region through two ion implantation processes with different ion implantation energy; removing the first ion implantation mask; forming a second ion implantation mask of which an edge is arranged at a boundary between the field and active regions, opening the active region; and forming a second doping region between a surface of the semiconductor layer and the first doping region, whereby a thickness between the first doping region and the surface of the semiconductor layer is made thin by the two ion implantation processes.

In accordance with still another aspect of the present invention, there is provided a method for forming a pinned photodiode in an image sensor, the method comprising the steps of: providing a semiconductor layer of a first conductivity type; forming a field oxide layer to isolate an active region from a field region; patterning a gate of a transfer transistor to transfer photoelectric charges generated in the photodiode; forming a first doping region of a second conductivity type in the active region using a first ion implantation mask, which covers a portion of the active region adjacent to the field region and opens an edge of the transfer transistor; forming a second doping region of the first conductivity type on the first doping region using a second ion implantation mask which covers the transfer transistor; forming a third doping region of the second conductivity type on the second doping region using a third ion implantation mask, which covers the portion of the active region adjacent to the field region and opens an edge of the transfer transistor, wherein the first and third doping regions are connected to each other at edges thereof so that the first and third doping regions have the same potential; and forming a fourth doping region of the first conductivity type on the third doping region using a fourth ion implantation mask that opens the active region.

In accordance with still another aspect of the present invention, there is provided a method of forming a pinned photodiode in an image sensor, the method comprising the steps of: providing a semiconductor layer of a first conductivity type; and alternatively forming N-type impurity regions and a P-type impurity region using first and second ion implantation masks, wherein the first ion implantation mask covers a portion of the active region adjacent to the field region and opens an edge of the transfer transistor and wherein the second ion implantation mask covers the transfer transistor.

BRIEF DESCRIPTION OF THE DRAWINGS

The above and other objects and features of the present invention will become apparent from the following description of the preferred embodiments given in connection with the accompanying drawings, in which:

FIG. 1 is a cross-sectional view illustrating a conventional pinned photodiode;

FIG. 2 is a cross-sectional view illustrating a photodiode in accordance with an embodiment of the present invention;

DETAILED DESCRIPTION OF THE PREFERRED EMBODIMENTS

Hereinafter, the present invention will be described in detail referring to the accompanying drawings.

In FIG. 2, a PPD structure according to an embodiment of the present invention is illustrated. Referring to FIG. 2, the PPD comprises: a P-epi layer grown to a thickness of approximately 5~10 µm on a $P^+$ substrate ($P^+$ SUB); deep and shallow $N^-$ doping regions 201 and 202 which are formed within the P-epi layer and formed by the stack-up of N type impurities having different energies through two ion implantation processes; a $P^0$ doping region 203 formed between the upper part of the deep $N^-$ doping region and the surface of the P-epi layer, wherein the width of the $P^0$ doping region 203 is larger than that of the shallow $N^-$ doping region and a portion thereof is formed on the P-epi layer.

Here, the P-epi layer is set to a concentration of about $E14/cm^3$, shallow $N^-$ doping region 202 to about $E17/cm^3$ and $P^0$ doping region 203 to about $E18/cm^3$, so that the depletion depth is deeply formed into the P-epi layer.

Figure 3:
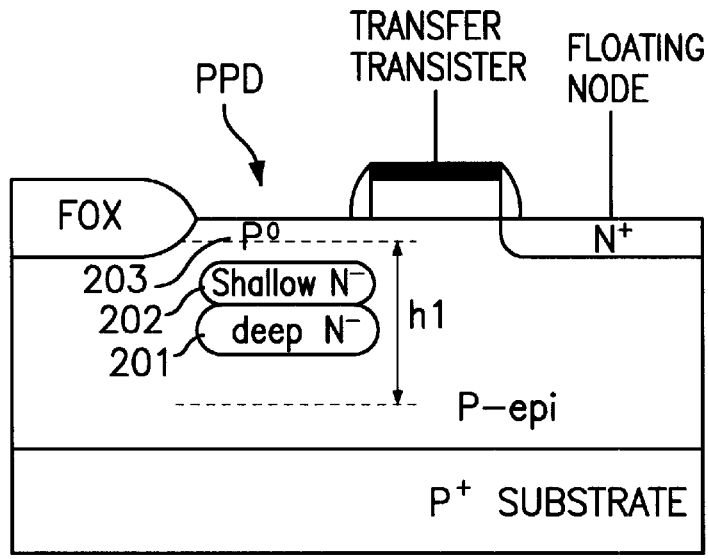
FIG. 3 is a cross-sectional view illustrating an operation of the photodiode in FIG. 2.
Figure 4:
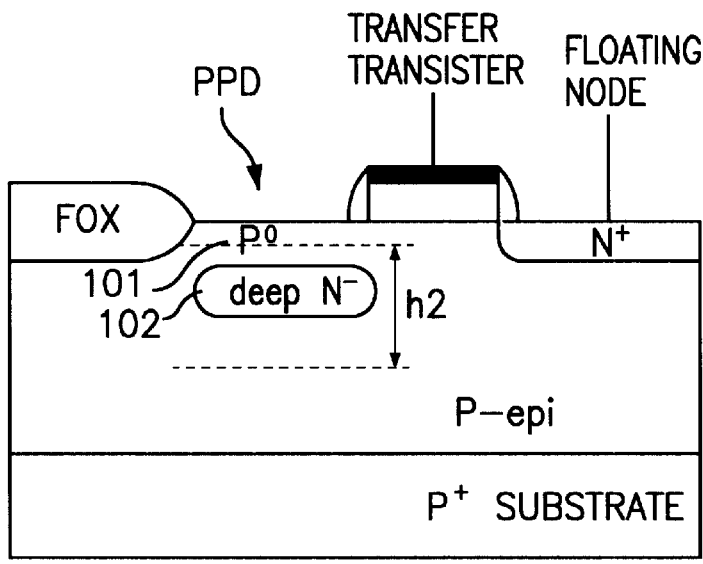
FIG. 4 is a cross-sectional view illustrating an operation of the pinned photodiode in FIG. 1.

FIGS. 3 and 4 are cross-sectional views for comparatively illustrating operations between the present invention and the prior art, through which the distinctive effects of the present invention will be described.

First, referring to FIG. 3, when a transfer transistor and a reset transistor (not shown in FIG. 3) are turned on, depletion occurs because of the applied voltage from the power supply and, when shallow $N^-$ doping region 202 and deep $N^-$ doping region 201 are fully depleted, the depletion depth is h1. On the contrary, in the prior art diode illustrated in FIG. 4, the depletion depth is h2 when deep $N^-$ doping region 102 beneath $P^0$ doping region 101 is fully depleted, because there exists only the deep $N^-$ doping region. Depletion depth h1 is larger than h2 since the value of the combined thicknesses of the deep and shallow $N^-$ doping regions is larger than of the single deep $N^-$ doping region 102 of the prior art.

Embodiments of the present invention can increase the depletion depth in a predetermined area, by forming a deep $N^-$ doping region through several repeated ion implantation processes, each having different energy levels.

FIGS. 5a to 5d are process cross-sectional views illustrating a method for manufacturing the structure of FIG. 2.

Figure 5A:
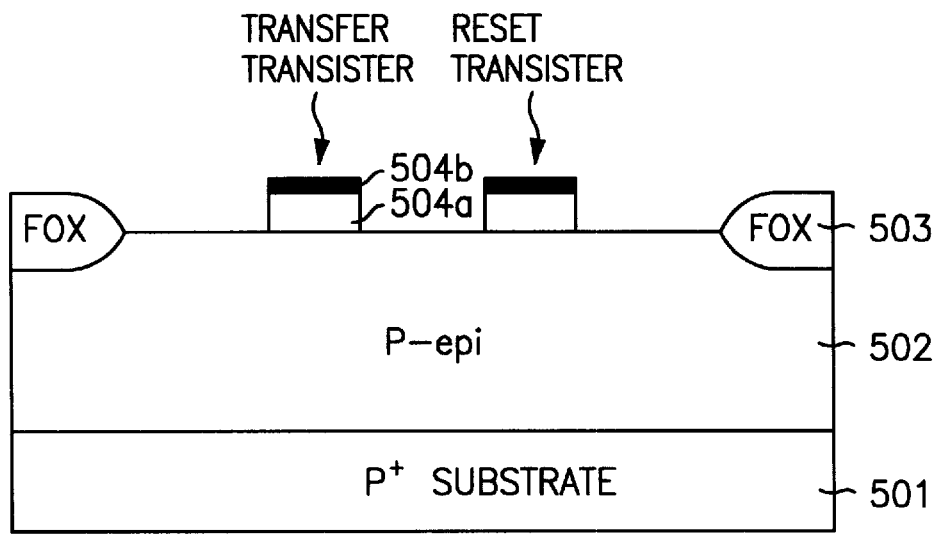
FIGS. 5a to 5d are cross-sectional views illustrating a method of fabricating a photodiode, in accordance with an embodiment of the present invention.

First, referring to FIG. 5a, a transfer transistor and a reset transistor are formed by the steps of: growing a P-epi layer 502 having a thickness of approximately 5~10 µm on a $P^+$ substrate 501; forming a field oxide layer (FOX) 503 for isolating elements in P-epi layer 502; and forming a polysilicon layer 504a and a tungsten silicide layer 504b.

Figure 5B:
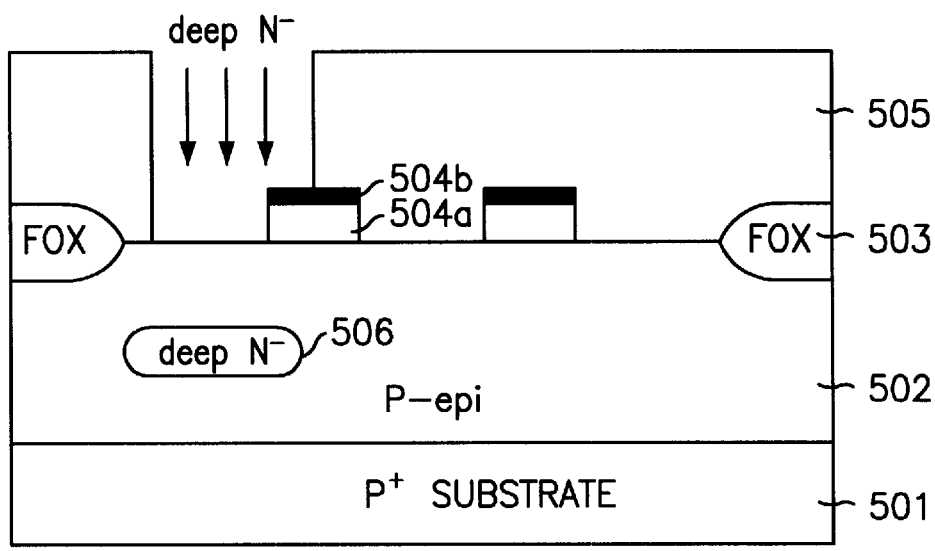
Figure 6A:
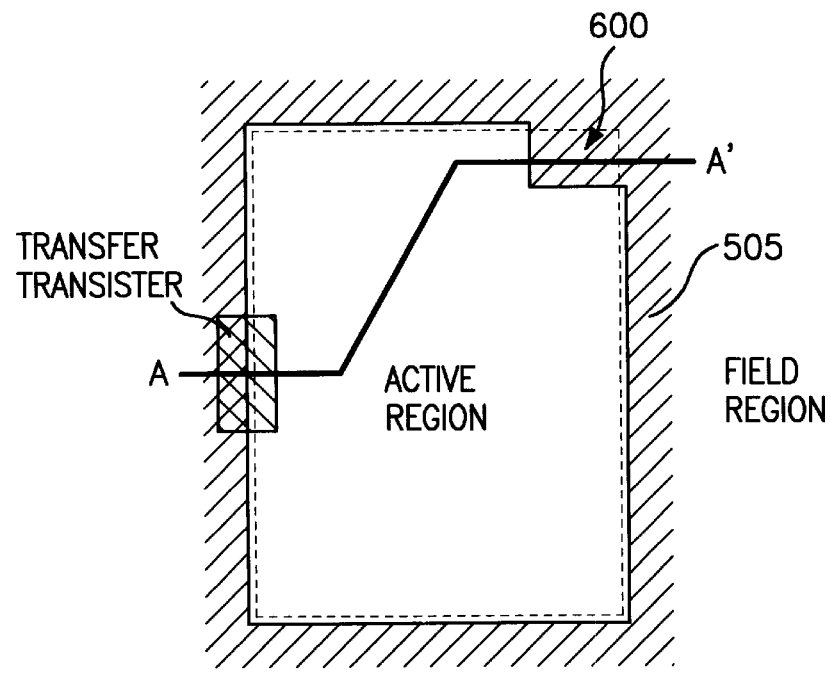
FIGS. 6a and 6b are layouts illustrating $N^-$ and $P^0$ ion implantation masks, respectively.

Subsequently, as illustrated in FIG. 5b, a deep $N^-$ doping region 506 is formed using an $N^-$ ion implantation mask 505 and carrying out $N^-$ ion implantation processes with high energy of more than about 200 keV. Referring briefly to FIG. 6a, the layout of the $N^-$ ion implantation mask 505 is shown having a pattern covering a portion of an active region 600. Accordingly, the edge of the $N^-$ ion implantation mask 505 is arranged primarily on the active region in the vicinity of the field region. That is, deep $N^-$ doping region 506 is not formed in a peripheral portion of active region 600 where the PPD is to be formed, because the N-type impurities are not implanted into that portion.

Figure 5C:
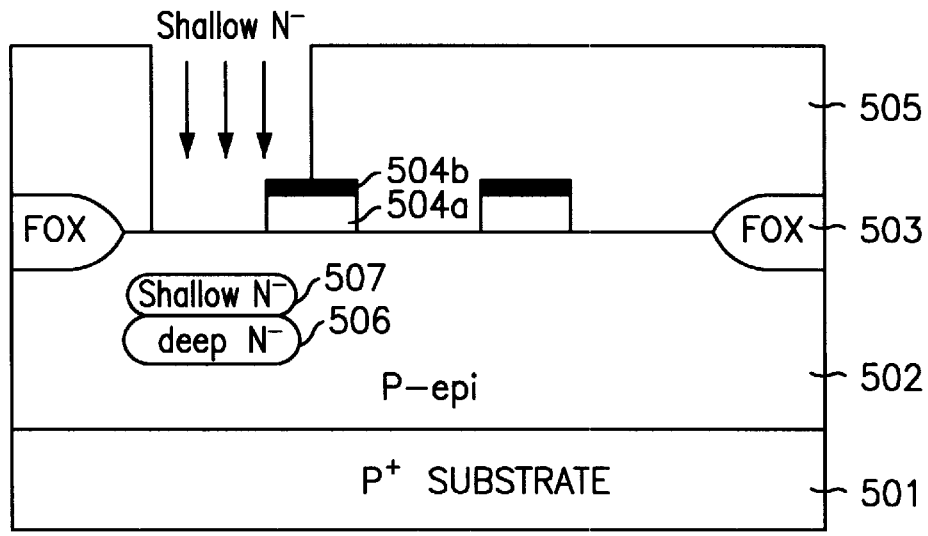

Next, as illustrated in FIG. 5c, a shallow $N^-$ doping region 507 is formed by carrying out another $N^-$ ion implantation process with an energy of less than about 100 keV, using the same $N^-$ ion implantation mask 505. Like deep $N^-$ doping region 506, shallow $N^-$ doping region 507 is not formed in a peripheral portion of active region 600.

Figure 5D:
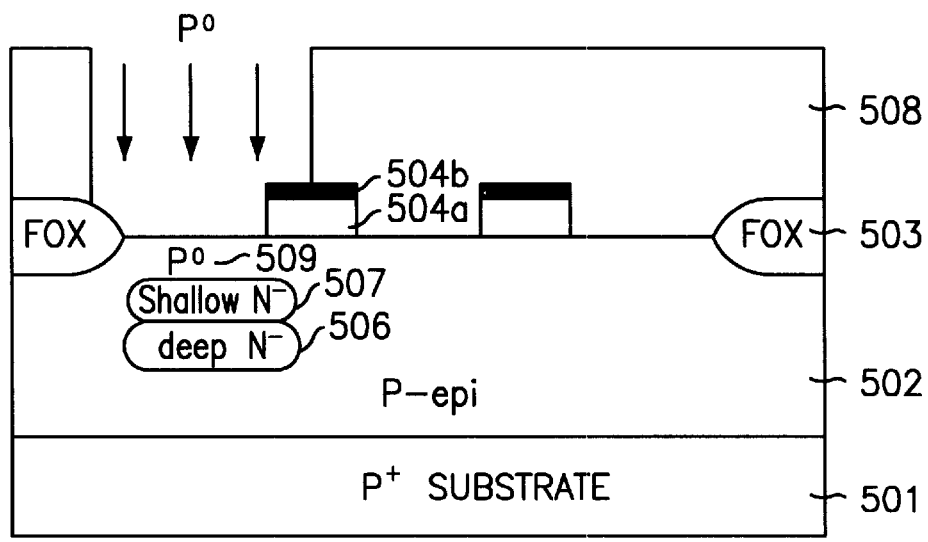
Figure 6B:
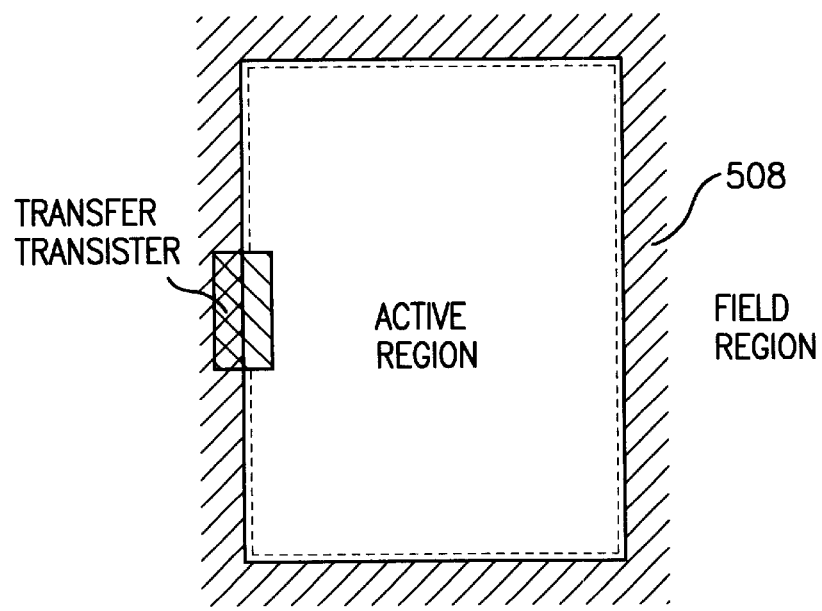

Further, as illustrated in FIG. 5d, a $P^0$ region 509 is formed through the steps of: removing the $N^-$ ion implantation mask 505; forming a $P^0$ ion implantation mask 508 for forming $P^0$; and carrying out $P^0$ ion implantation processes. As illustrated in FIG. 6b, $P^0$ ion implantation mask 508 is patterned to open all active regions where the PPD is to be formed.

Figure 7:
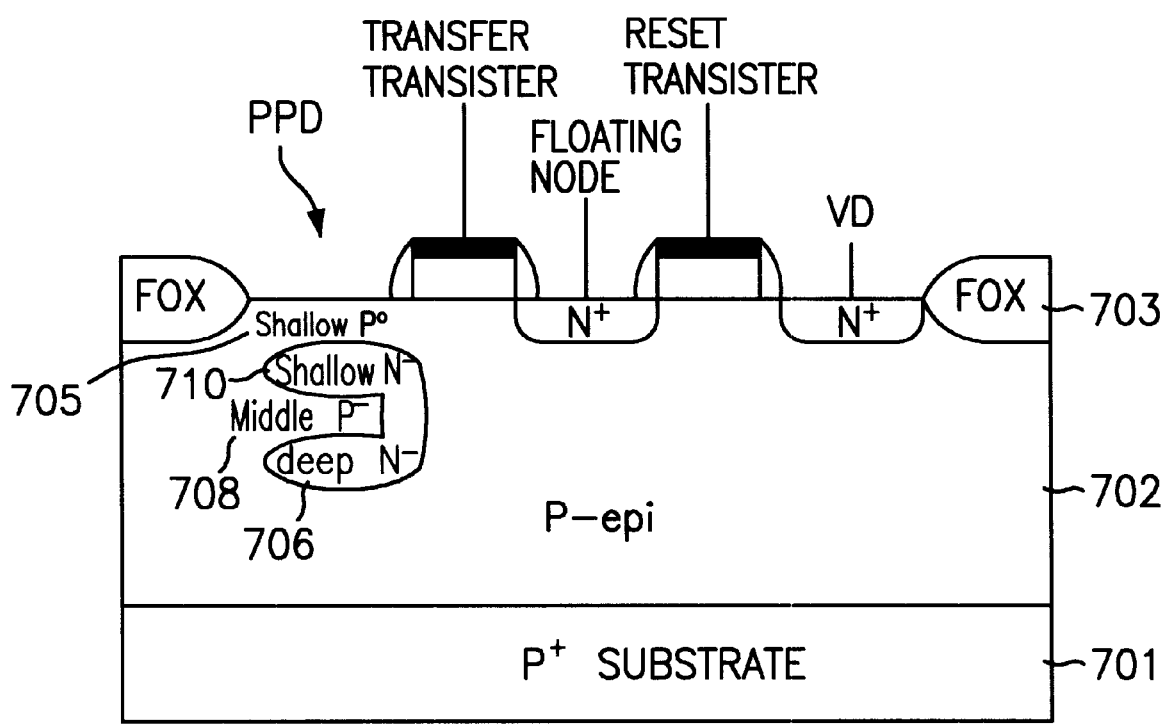
FIG. 7 is a cross-sectional view illustrating a photodiode, in accordance with another embodiment of the present invention.

In FIG. 7, a PPD structure according to another embodiment of the present invention is illustrated. Referring to FIG. 7, the PPD structure includes a P-epi layer 702 grown to a thickness of approximately 5~10 µm on a $P^+$ substrate 701, and a shallow $N^-$ doping region 710 formed within P-epi layer 702 and disposed at the lower part of the edge of a transfer transistor. In addition, a deep $N^-$ doping region 706 is formed within P-epi layer 702 and vertically set apart from the shallow $N^-$ doping region 710. However, deep $N^-$ doping region 706 is mutually connected to shallow $N^-$ doping region 710 at the left edge of the transfer transistor. Accordingly, an inclined U-shaped $N^-$ doping region is formed within P-epi layer 702. Furthermore, a middle $P^-$ doping region 708 is disposed between shallow $N^-$ doping region 710 and deep $N^-$ doping region 706 so that the concentration of middle $P^-$ doping region 708 may be higher than that of P-epi layer 702. A shallow $P^0$ doping region 705 is disposed on shallow $N^-$ doping region 710, beneath the surface of P-epi layer 702.

The present invention is carried out under conditions such that P-epi layer has a dopant concentration of approximately $E14/cm^3$, shallow $N^-$ doping region 710 and middle $P^-$ doping region 708 each have a dopant concentration of approximately $E17/cm^3$, and shallow $P^0$ doping region 705 has a dopant concentration of approximately $E18/cm^3$.

As a result, the pinned photodiode according to another embodiment of the present invention has four PN junctions; i.e., a first PN junction between shallow $P^0$ doping region 705 and shallow $N^-$ doping region 710, a second PN junction between middle $P^-$ doping region 708 and shallow $N^-$ doping region 710, a third PN junction between deep $N^-$ doping region 706 and middle $P^-$ doping region 708, and a fourth PN junction between deep $N^-$ doping region 706 and lower P-epi layer 702. Of course, this multiple PN junction structure can be made by alternately forming the N-type doping regions and the P-type doping regions within P-epi layer 702. In order to insure that the P-type doping regions have the same potential in P-epi layer 702, shallow $P^0$ doping region 705, middle $P^-$ doping region 708 and P-epi layer 702 are directly in contact with each other in the vicinity of the field oxide layer. Accordingly, it becomes possible to accomplish complete implantation in a CMOS image sensor using a power supply voltage of less than 3.3V.

The PPD according to another embodiment of the present invention allows the charge capacity to be greater than that of the prior art photodiode of FIG. 1, which has only two PN junctions. That is, the increased capacity to save photogenerated charges makes it possible to obtain the desired quantum efficiency, which a high-sensitivity sensor requires. Furthermore, it is possible to obtain deeper depletion depth than the prior art, since middle $P^-$ doping region 708, deep $N^-$ doping region 706 and shallow $N^-$ doping region 710 are all completely implanted, thereby further increasing the collection area for photogenerated charges and obtaining the quantum efficiency image which the sensor requires.

FIGS. 8a to 8e are cross-sectional views illustrating a method for fabricating the photodiode in accordance with another embodiment of the present invention.

Figure 8A:
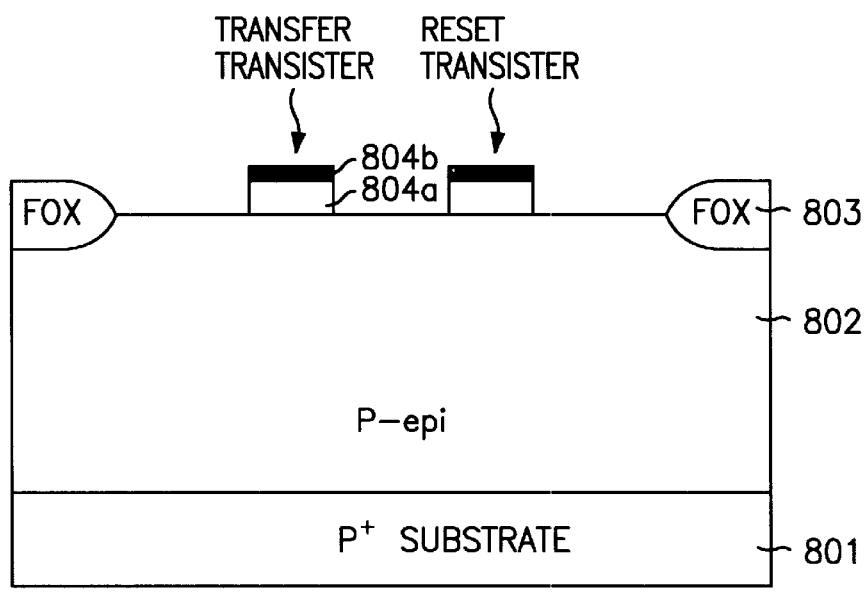
FIGS. 8a to 8e are cross-sectional views illustrating a method of fabricating a photodiode, in accordance with another embodiment of the present invention.

First, as shown in FIG. 8a, a P-epi layer 802 is grown to a thickness of about 5~10 $\mu$m on a $P^+$ substrate 801 and field oxide layers 803, for isolating elements, are formed in P-epi layer 802. Also, a polysilicon layer 804a and a tungsten silicide layer 804b are formed on P-epi layer 802 to form transfer and reset transistors through mask and etching processes.

Figure 8B:
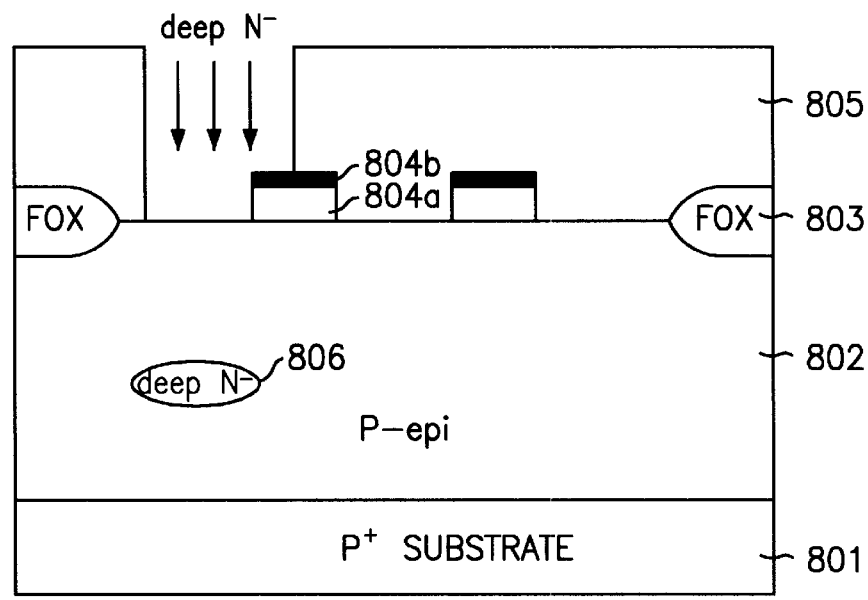
Figure 9A:
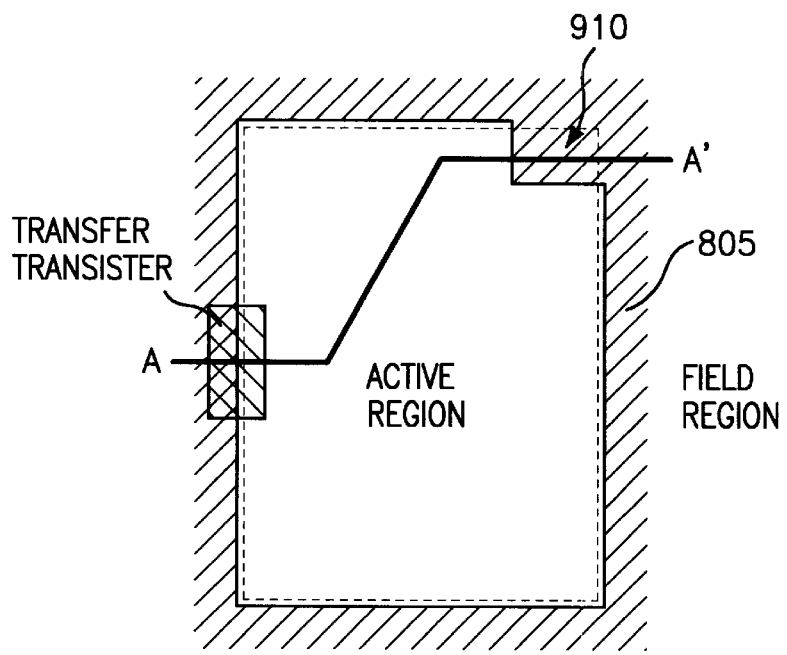
FIGS. 9a to 9c are layouts illustrating ion implantation masks.

Next, as shown in FIG. 8b, a deep $N^-$ doping region 806 is formed by $N^-$ ion implantation processes with high energy of approximately 200 KeV using an $N^-$ ion implantation mask 805. A layout of $N^-$ ion implantation mask 805 is illustrated in FIG. 9a. Ion implantation mask 805 has a pattern covering a portion of an active region and exposes a portion of the gate of the transfer transistor, wherein the edge of N ion implantation mask 805 is arranged primarily on active region for forming the PPD. That is, similar to the method illustrated in FIG. 5, the deep $N^-$ doping region 806 is not formed in a peripheral portion of the active region where the PPD is to be formed, because N-type impurities are not implanted into that portion.

Figure 8C:
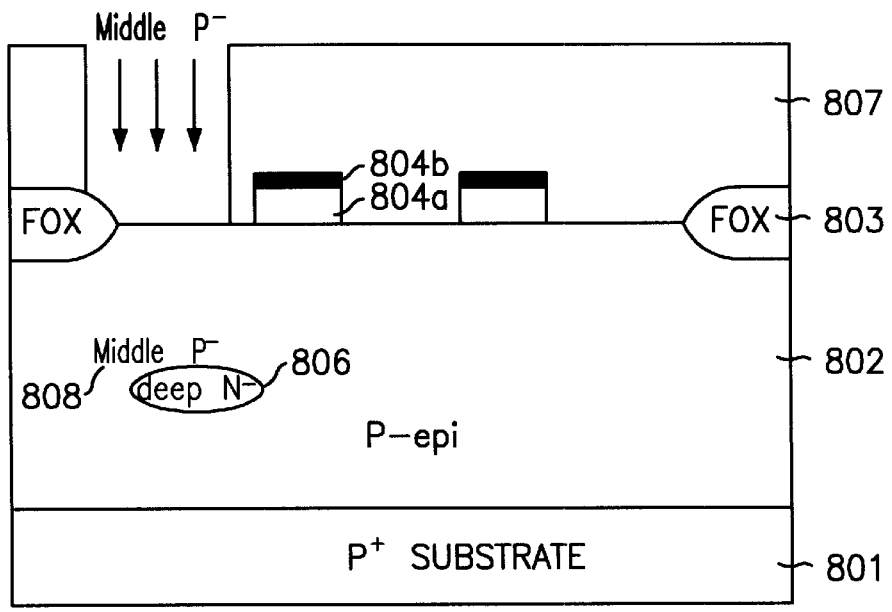
Figure 9B:
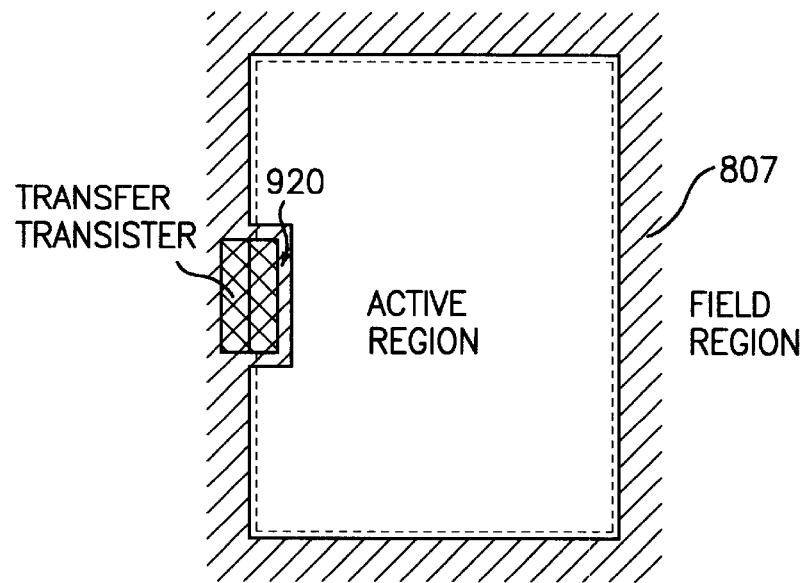

Then, as shown in FIG. 8c, a middle $P^-$ doping region 808 is formed on deep $N^-$ doping region 806, by removing $N^-$ ion implantation mask 805, forming a $P^-$ ion implantation mask 807 and carrying out a $P^-$ ion implantation process with an energy of approximately 150 KeV. As illustrated in FIG. 9b, $P^-$ ion implantation mask 807 is patterned to fully cover the transfer transistor and the edge of $P^-$ ion implantation mask 807 is arranged primarily at the boundary between the active region and the field region, or on the field region. That is, middle $P^-$ doping region 806 is not formed at the lower part of the transfer transistor because $P^-$ ion implantation mask 807 covers that portion of the transfer transistor.

Figure 8D:
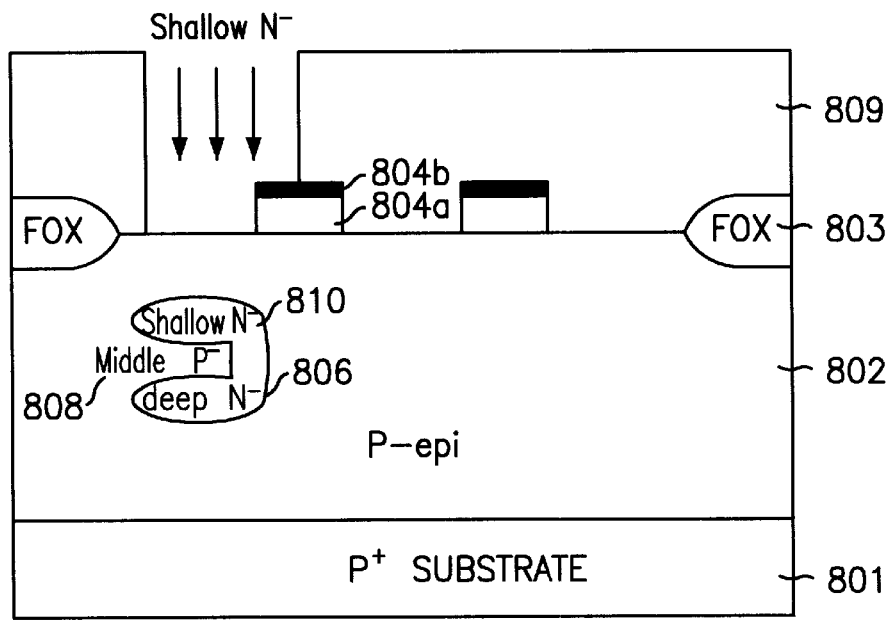

As shown in FIG. 8d, after removing $P^-$ ion implantation mask 807, a shallow $N^-$ doping region 810 is formed on middle $P^-$ doping region 808 using a $P^-$ ion implantation mask 809, which is the same as $N^-$ ion implantation mask 805. In a preferred embodiment, the ion implantation for N-type impurities is carried out in a range of approximately 100 keV. It should be noted that an edge of $P^-$ ion implantation mask 809 is positioned at the top of polysilicon layers 804a. So, deep $N^-$ doping region 806 and shallow $N^-$ doping region 810 are directly connected under tungsten silicide layer 804b of the transfer transistor.

Figure 8E:
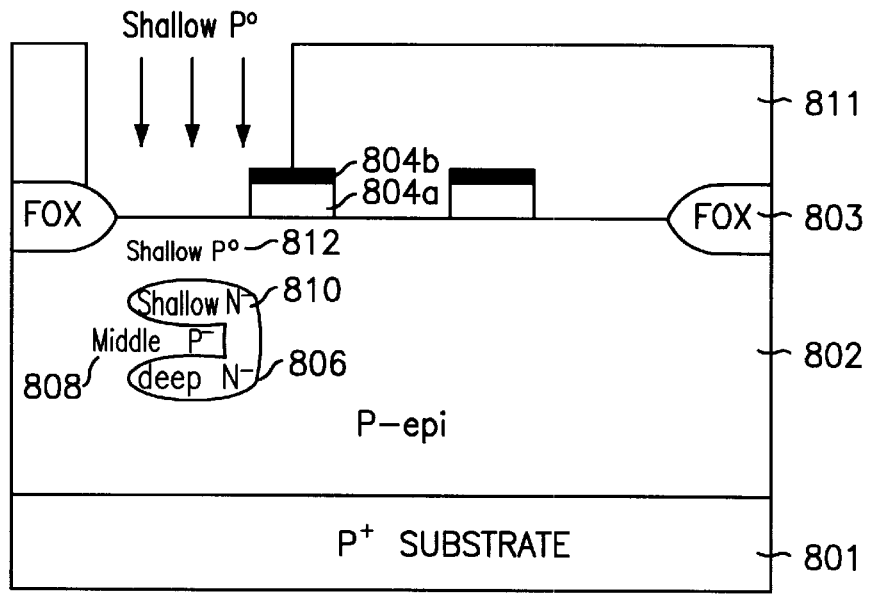
Figure 9C:
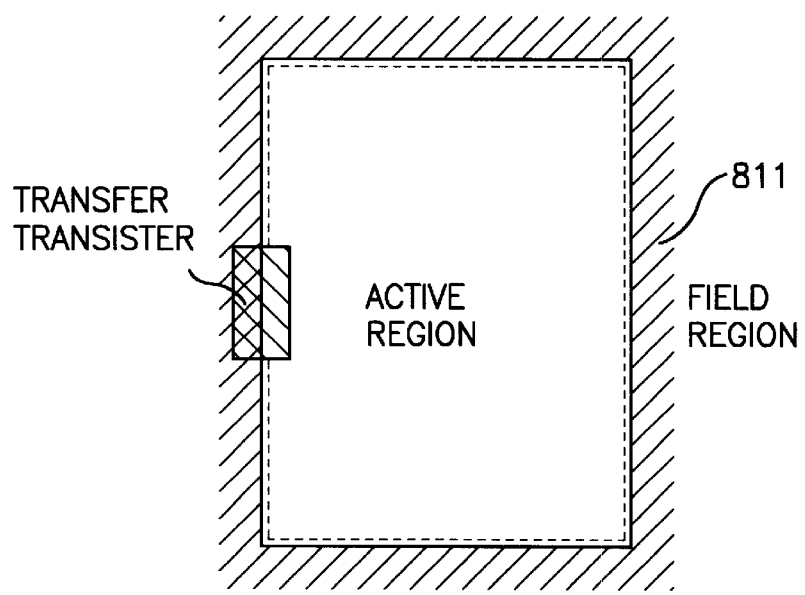

As shown in FIG. 8e, a shallow $P^0$ region 812 is formed by removing $N^-$ ion implantation mask 809, forming a $P^0$ ion implantation mask 811 and carrying out ion implantation with a low energy of less than about 50 KeV. As illustrated in FIG. 9c, the $P^0$ ion implantation mask 811 is patterned to open all of the active region where the PPD is to be formed.

In summary, the PPD according to the present invention increases the depth of the depletion region by forming a plurality of PN junctions. This increase of the depletion region through a plurality of PN junctions concentrates the photogenerated charges, which are produced by the incident photons, into the light sensing region of the CMOS image sensor, increasing the charge accumulating capacity of the PPD. This large charge accumulating capacity may produce increased light sensitivity and improve the resolution of the CMOS image sensor.

Although the preferred embodiments of the invention have been disclosed for illustrative purposes, those skilled in the art will appreciate that various modifications, additions, and substitutions are possible without departing from the scope and spirit of the invention as disclosed in the accompanying claims.

What is claimed is:

1. A pinned photodiode in an image sensor comprising:
   a semiconductor layer of a first conductivity type; and
   at least two vertically spaced doping regions of a second conductivity type alternately formed in the semiconductor layer, such that portions of the semiconductor layer are interposed between successive doping regions, wherein the doping regions are connected to each other at edges thereof,
   wherein a plurality of PN junctions are formed between the doping regions and the semiconductor layer.

2. The pinned photodiode as recited in claim 5, wherein the portions of the semiconductor layer interposed between successive doping regions have a lower doping concentration than a doping concentration of a surface region of the semiconductor layer.

3. The pinned photodiode as recited in claim 1, further comprising a heavily doped semiconductor substrate formed beneath the semiconductor layer, wherein the semiconductor layer is an epitaxial layer formed on the semiconductor substrate.

4. The pinned photodiode as recited in claim 2, wherein an impurity concentration of the portions of the semiconductor layer interposed between successive doping regions and the doping regions themselves are approximately $E17/cm^3$ and an impurity concentration of the surface region is approximately $E18/cm^3$.

5. The pinned photodiode as recited in claim 1, wherein the first and second conductivity types are P and N types, respectively.

* * * * *